(12) United States Patent
Lee et al.

(10) Patent No.: US 6,699,749 B1
(45) Date of Patent: Mar. 2, 2004

(54) METHOD FOR MANUFACTURING A METAL-INSULATOR-METAL CAPACITOR

(75) Inventors: Seung-Gun Lee, Seoul (KR); Il-Goo Kim, Seongnam-si (KR); Ho-Sen Chang, Suwon-si (KR); Ju-Hyuk Chang, Suwon-si (KR); Sang-Rok Hah, Seoul (KR)

(73) Assignee: Samsung Electronics, Co., Ltd., Kuungki-do (KR)

( * ) Notice: Subject to any disclaimer, the term of this patent is extended or adjusted under 35 U.S.C. 154(b) by 0 days.

(21) Appl. No.: 10/429,321

(22) Filed: May 5, 2003

(30) Foreign Application Priority Data

Nov. 13, 2002 (KR) .......................... 2002-70235

(51) Int. Cl.$^7$ .......................... H01L 21/8242
(52) U.S. Cl. .......................... 438/240; 438/3; 438/250; 438/381
(58) Field of Search .......................... 438/3, 238–240, 438/250–256, 381, 393–396

(56) References Cited

U.S. PATENT DOCUMENTS 6,599,807 B2 * 7/2003 Lim et al. .................. 438/396

* cited by examiner

*Primary Examiner*—H. Jey Tsai
(74) *Attorney, Agent, or Firm*—F. Chau & Associates, LLP

(57) ABSTRACT

A method of manufacturing a MIM capacitor having a bottom electrode is provided by forming a metal wire including copper on a substrate. After the metal wire is formed on the substrate, a dielectric film is formed on the metal wire. A top electrode film is formed on the dielectric film, and then the top electrode film is etched to form a top electrode. A hard metallic polymer formed during the etching of the top electrode film is removed using a mixture of an oxygen gas and a fluorocarbon based gas. The lifting of the thin films is effectively prevented, and the yield of the manufacturing process for manufacturing a MIM capacitor is increased. Additionally, the MIM capacitor has a uniform capacitance because the damage to the dielectric film is prevented, and the oxidation of the bottom electrode is also prevented.

20 Claims, 9 Drawing Sheets

METHOD FOR MANUFACTURING A METAL-INSULATOR-METAL CAPACITOR

BACKGROUND OF THE INVENTION

1. Technical Field of the Invention

The present invention relates to a method for manufacturing a metal-insulator-metal (MIM) capacitor; more particularly, a method for manufacturing a MIM capacitor having a bottom electrode including copper, which can effectively prevent the lifting of thin films and the oxidation of the bottom electrode.

2. Discussion of the Related Art

As semiconductor devices become more highly integrated and the usage of the semiconductor devices in electronic devices, such as information processing apparatuses and home appliances, increases, the semiconductor devices are required to have a larger processing capacity and faster processing speed.

In general, the storage capacity of a random access memory (RAM) chip can be expressed empirically by using Moore' law indicating the general development of a memory chip. According to Moore' law, the storage capacity of a memory chip increases four times every three years. The increase of the storage capacity of a memory chip is accomplished by reducing the size of the semiconductor device, and increasing the length of a silicon chip in accordance with the size reduction of the semiconductor device.

As the size of the semiconductor device installed in the silicon chip is reduced, interconnect lines of the semiconductor device are also reduced. The reduction in the size of a semiconductor device also causes the interconnect lines to be disposed closer together. When the interconnection lines are closely disposed, the interconnect lines interfere with each other. If the interval between the interconnection lines falls below a predetermined value, the entire signal is delay because of the interference between the interconnection lines. To increase the processing speed of a semiconductor device, a reduction of the specific resistance in the metal used for forming the interconnection lines is required.

Typically, the interconnection lines of a semiconductor device are formed using aluminum (Al) or aluminum alloy having the specific resistance of approximately 2.66 $\mu\Omega$ cm. In 1998, International Business Machine Co. disclosed a method for forming interconnection lines with copper (Cu). Various researchers have been developing methods for forming and improving the formation of interconnection lines, e.g., a metal wiring or a metal-insulator-metal (MIM) capacitor using copper.

Other methods of forming a semiconductor device using copper are disclosed in U.S. Pat. No. 5,935,762 (issued to Chang-Ming Dai), Korean Laid Open Patent Publication No. 2001-110919, and Korean Laid Open Patent Publication No. 2002-55887.

In addition, Japanese Laid Open Patent Publication No. 2000-352827 provides a method for removing a hardened photoresist generated during the patterning of an insulation film using a non-oxidation gas after the insulation film is formed on a metal film including copper. Also, Japanese Laid Open Patent Publication No. 2000-82695 discloses a method for removing a copper halide based compound formed during the etching of a copper thin film with a halogen gas like chlorine ($Cl_2$) after forming a passivation film including titanium (Ti), titanium compound, tantalum compound, tungsten compound or aluminum alloy on the copper thin film.

FIGS. 1A to 1C are cross-sectional views illustrating a conventional method of manufacturing a metal-insulator-metal capacitor including a copper bottom electrode.

Referring to FIG. 1A, after an interlayer dielectric film 15 including oxide is formed on a semiconductor substrate 10 such as a silicon wafer, the interlayer dielectric film 15 is etched to form a groove or a trench in the interlayer dielectric film 15.

With a copper damascene process, a copper film is deposited in the trench or the groove by a sputtering process, a chemical vapor deposition process, or an electro plating process. Then, the copper film is polished using a chemical-mechanical polishing (CMP) process, thereby forming a metal wire 20 in the interlayer dielectric film 15.

Subsequently, a dielectric film 25 is formed on the interlayer dielectric film 15 including the copper metal wire 20, and a top electrode film 30 is formed on the dielectric film 25. The top electrode film 30 includes tantalum (Ta), tantalum nitride (TaN), titanium (Ti), or titanium nitride (TiN).

Referring to FIG. 1B, to manufacture the MIM capacitor, a photoresist film is coated on the top electrode film 30, and the photoresist film is patterned so that a photoresist pattern 35 is created for forming a top electrode of the MIM capacitor.

Referring to FIG. 1C, the top electrode film 30 is etched using the photoresist pattern 35 as an etching mask such that the top electrode 40 is formed on the dielectric film 25.

When the photoresist pattern 35 is removed using an ashing process and a rinsing process, the MIM capacitor 50 having the copper bottom electrode is formed on the substrate 10.

In a conventional method for manufacturing the MIM capacitor, a hard metallic polymer is formed when the top electrode film having a thickness of below 1,000 Å is etched, forming the top electrode. The hard metallic polymer includes metal oxide or metal nitride like tantalum oxide ($TaO_x$), tantalum nitride ($TaN_x$), titanium oxide ($TiO_x$), titanium nitride ($TiN_x$) or carbon nitride ($CN_x$) wherein x denotes a positive number. It is difficult, if not impossible, to remove the hard metallic polymer by using an ashing process or a wet cleaning process.

FIGS. 2A and 2B are cross-sectional views showing the disadvantages of the conventional method for manufacturing the MIM capacitor.

Referring to FIGS. 1B and 2A, when the top electrode film 30 is etched using the photoresist pattern 35 as the etching mask, the metal or the metal compound of the top electrode film 30 such as tantalum, tantalum nitride, titanium, or titanium nitride can be reacted with an etching gas including chlorine ($Cl_2$), nitrogen ($N_2$) and boron chloride ($BCl_3$). As a result, the hard metallic polymer 55 including metal oxide or metal nitride adheres to the side of the photoresist pattern 35.

Because the hard metallic polymer 55 cannot be removed using the ashing or the wet cleaning process, the hard metallic polymer 55 remains on the top electrode 40 of the MIM capacitor 50 even after the photoresist pattern 35 is removed. While performing a successive process, the hard metallic polymer 55 remains and a metal wiring is formed on the MIM capacitor 50 and electrically connects the top electrode 40 of the MIM capacitor 50. Thus, an electrical short is formed between the MIM capacitor 50 and the metal wiring.

The hard metallic polymer 55 can be removed using a high temperature ashing process that uses an $O_2$ gas and a CF$_4$ gas at a high temperature, e.g., above 250° C. As shown in FIG. 2, the thin films of the MIM capacitor 50 like the bottom electrode, the dielectric film, and the top electrode may be lifted because of the different thermal characteristics, e.g., coefficient of thermal expansion, of each of the thin films influenced by the high temperature associated with the ashing process. In particular, the top electrode and the dielectric film may be lifted during the high temperature ashing process.

In addition, the copper bottom electrode and other metal film may be easily oxidized during the high temperature ashing process, which creates a MIM capacitor having a uniform capacitance or the capacitance of the MIM capacitor may not meet a desired value. Thus, the overall failure rate of the capacitor may be high during the manufacturing process. Those failures may relate to the thermal characteristics of the thin films of the MIM capacitor, and to the structural characteristic of the MIM capacitor including the thin films having a thickness of below 1,000 Å.

A need therefore exists for a method of manufacturing a metal-insulator-metal (MIM) capacitor which prevents oxidizing of a bottom electrode and lifting of thin films of the MIM capacitor by effectively removing a hard metallic polymer formed during the formation of the MIM capacitor

SUMMARY OF THE INVENTION

According to an embodiment of the present invention, a method is provided for manufacturing a metal-insulator-metal capacitor by employing a dual damascene process, which can efficiently remove a hard metallic polymer with an etching gas at a predetermined temperature.

According to another embodiment of the present invention, a method is provided for manufacturing a metal-insulator-metal capacitor by forming a metal wire including copper on a substrate, after the metal wire including copper is formed on the substrate, a dielectric film is formed on the metal wire. Then, a top electrode film, e.g., tantalum, tantalum nitride, titanium, titanium nitride, ruthenium, or platinum, is formed on the dielectric film, and etched to form a top electrode. Subsequently, a hard metallic polymer, e.g., tantalum oxide, tantalum nitride, titanium oxide, or titanium nitride, is formed during the etching process to etch the top electrode film using a gas mixture including an oxygen gas and a fluorocarbon based gas such as CF$_4$, C$_2$F$_6$, C$_3$F$_8$, C$_4$F$_6$, or C$_5$F$_8$ at a temperature in the range of about 150° C. to about 250° C. for approximately 20 to 40 seconds. The flow rate of the fluorocarbon based gas is about 2 percent or less of the flow rate of the gas mixture.

According to another embodiment of the present invention, a method is provided for manufacturing a metal-insulator-metal capacitor by employing a dual damascene process. The method provides forming an insulation film on a semiconductor substrate, and forming a via hole and a trench in the insulation film. Next, a contact including copper and a metal wiring including copper are formed in the via hole and in the trench, respectively. After the formation of the contact and the metal wiring, a dielectric film is formed on the insulation film and the metal wiring. Next, a top electrode film is deposited on the dielectric film. Then, the top electrode film is coated with a photoresist, and the photoresist is patterned to form a top electrode of the MIM capacitor. Next, the top electrode film is etched to form the top electrode. A hard metallic polymer is formed during the etching process, which removes the top electrode film from the top electrode.

According to the embodiments of present invention, the hard metallic polymer formed during the formation of the top electrode of the MIM capacitor can be removed using a gas mixture including an oxygen gas and a fluorocarbon based gas at a predetermined temperature. The predetermined temperature is based in part on the thermal characteristics of the thin films like the top electrode, the dielectric film, and the bottom electrode. Therefore, the lifting of the thin films can be effectively prevented, and the yield of the manufacturing process for manufacturing the MIM capacitor can be significantly increased. Also, the MIM capacitor has a uniform capacitance because the damage to the dielectric film is prevented, and the oxidation of the bottom electrode is prevented.

BRIEF DESCRIPTION OF THE DRAWINGS

The above and other objects and advantages of the present invention will become readily apparent by reference to the following detailed description when considered in conjunction with the accompanying drawings wherein.

DESCRIPTION OF PREFERRED EMBODIMENTS

FIGS. 3A to 3E are cross-sectional views illustrating a method of manufacturing a MIM capacitor according to a preferred embodiment of the present invention.

Figure 1A:
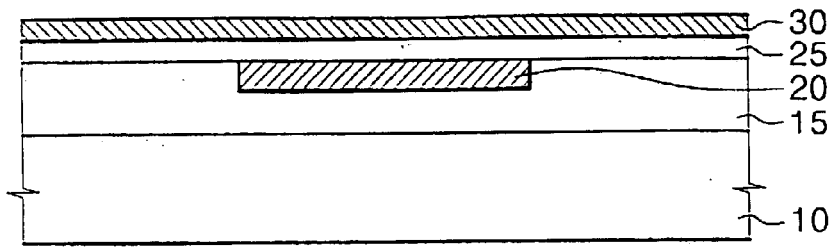
FIGS. 1A to 1C are cross-sectional views illustrating a conventional method of manufacturing a metal-insulator-metal capacitor including a copper bottom electrode.
Figure 1B:
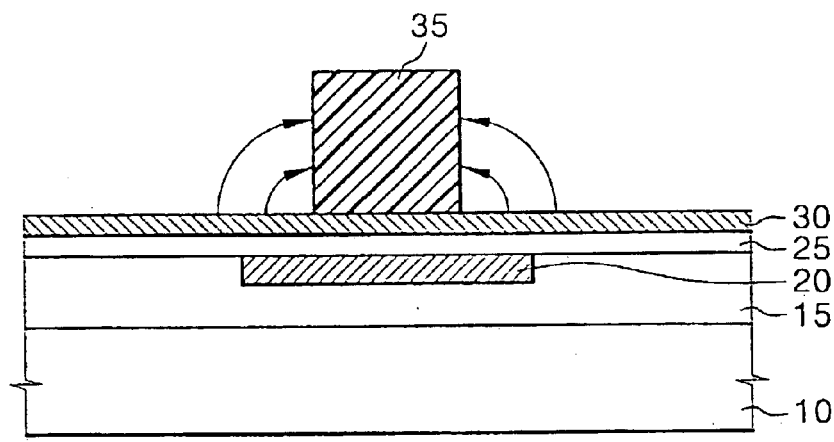
Figure 1C:
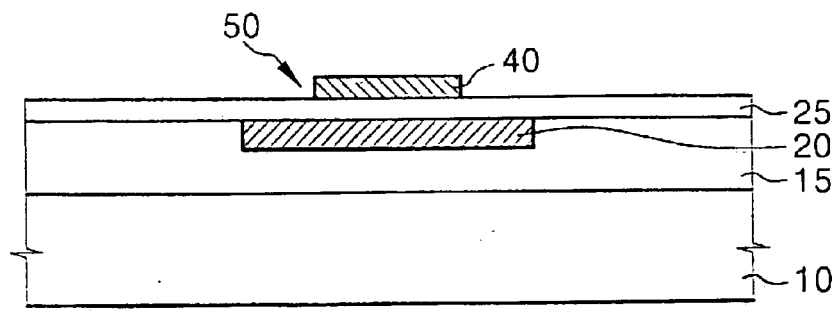
Figure 2A:
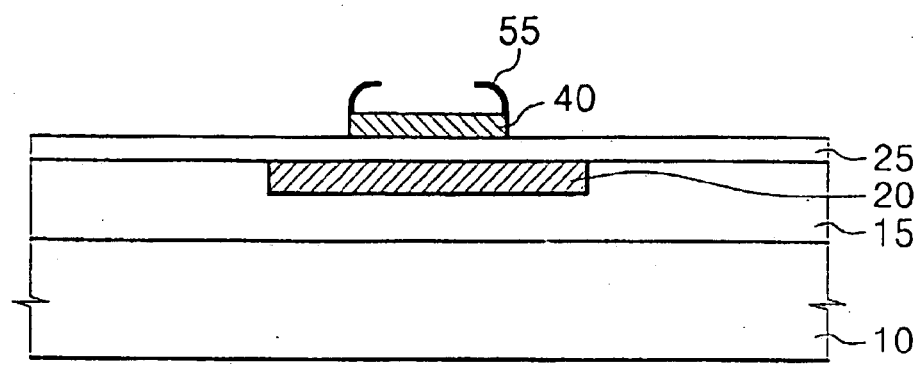
FIGS. 2A and 2B are cross-sectional views showing a conventional method of manufacturing the MIM capacitor.
Figure 2B:
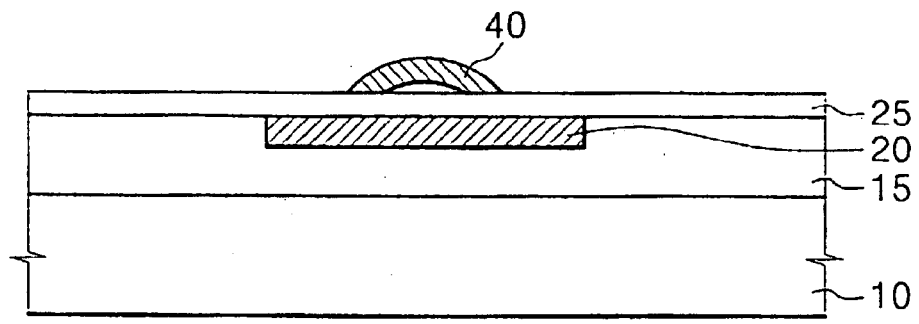
Figure 3A:
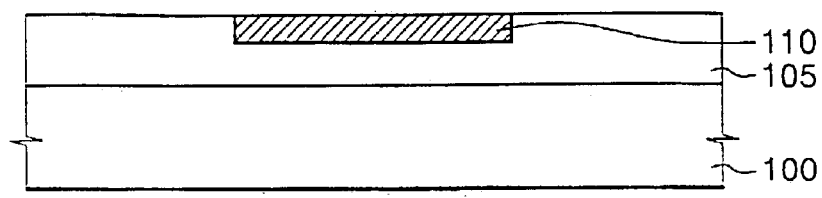
FIGS. 3A to 3E are cross-sectional views illustrating a method of manufacturing a MIM capacitor according to a preferred embodiment of the present invention.

Referring to FIG. 3A, after an insulation film 105 is formed on a semiconductor substrate 100, a groove or a trench having a predetermined shape and dimension is formed in the insulation film 105 by patterning the insulation film 105. The insulation film 105 may include tetraethylortho silicate (TEOS), low temperature tetraethylortho silicate (LT-TEOS), plasma enhanced tetraethyloxysilane (PE-TEOS), or borophosphosilicate glass (BPSG).

Subsequently, a metal wire 110 is formed in the trench or the groove by employing a damascene process. That is, after the trench or the groove is formed in the insulation film 105, the trench or the groove is filled with copper (Cu) using a sputtering process, a chemical vapor deposition process, or an electro plating process. The copper film is then polished using a chemical-mechanical polishing (CMP) process, thereby forming the metal wire 110 buried in the trench or the groove of the insulation film 105. The metal wire 110 including copper serves as a bottom electrode of a MIM capacitor.

Figure 3B:
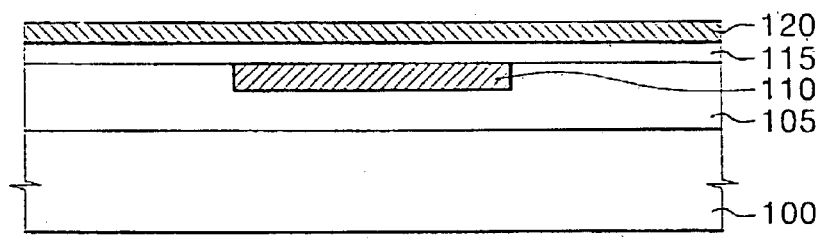

Referring to FIG. 3B, a dielectric film 115 is formed on the insulation film 105 including the metal wire 110. The dielectric film 115 includes a non-oxide material. For example, the dielectric film 115 can include a nitride, such as silicon nitride ($Si_xN_y$) or boron nitride (BN), or a carbide such as silicon carbide (SiC). The dielectric film 115 has one film comprising either a nitride or a carbide. In addition, an oxide such as silicon oxide ($SiO_2$) can be formed on the nitride or the carbide thereby forming a dielectric film 115 having a multi-layered structure comprising a nitride film and an oxide film, or a carbide film and an oxide film.

Then, a top electrode film 120 is formed on the dielectric film 115. The top electrode film includes tantalum nitride (TaN), tantalum (Ta), titanium (Ti), titanium nitride (TiN), ruthenium (Ru), or platinum (Pt). In this case, the dielectric film 115 including silicon nitride serves as a barrier layer for preventing the diffusion of the copper in the bottom electrode of the MIM capacitor.

Figure 3C:
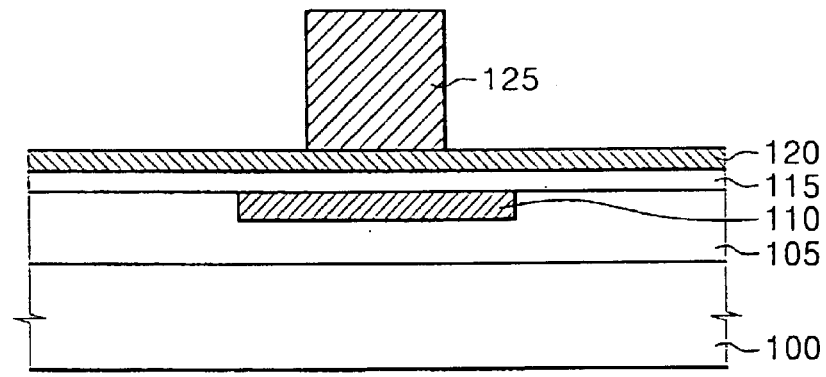

Referring to FIG. 3C, after a photoresist film (not shown) is coated on the top electrode film 120, the photoresist film is patterned by a photolithography process so that a photoresist pattern 125 is used as a mask to form the top electrode of the MIM capacitor.

Figure 4:
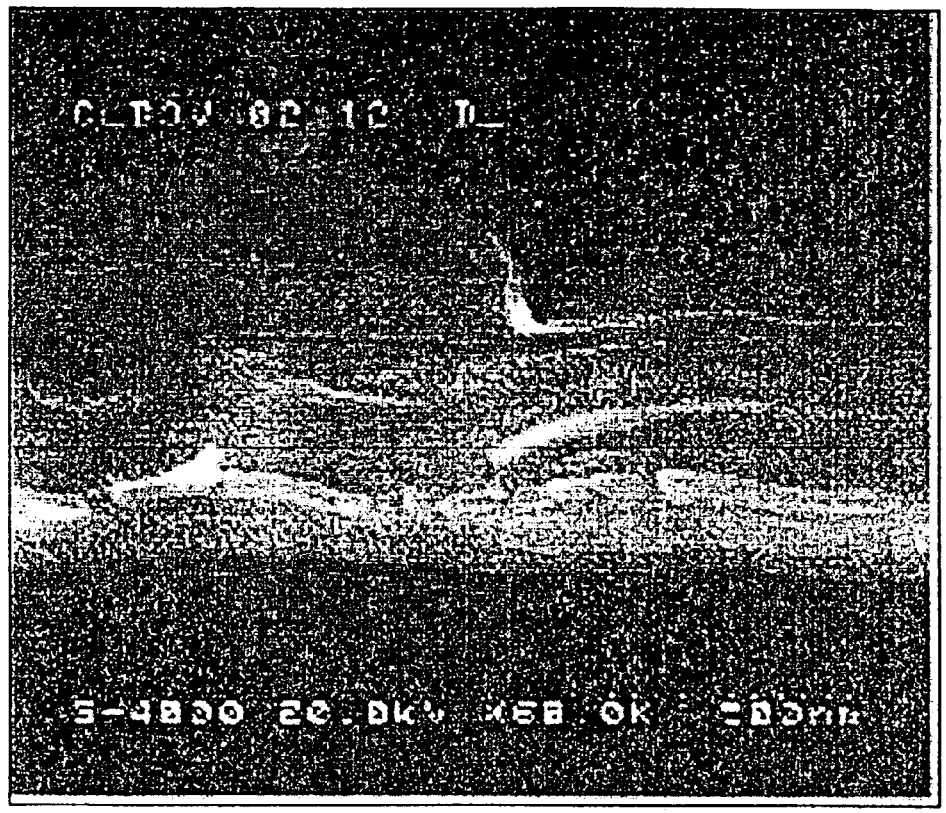
FIG. 4 is an electron microscopic picture showing a hard metallic polymer formed during etching of a top electrode film for forming a MIM capacitor according a preferred embodiment of the present invention.

FIG. 4 is an electron microscopic picture showing a hard metallic polymer formed during the etching of the top electrode film for forming the MIM capacitor according another preferred embodiment of the present invention.

Figure 3D:
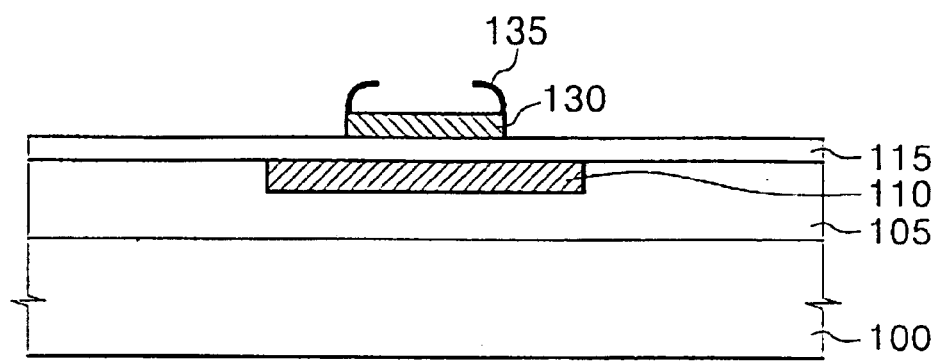

Referring to FIGS. 3D and 4, the top electrode film 120 is etched using the photoresist pattern 125 as an etching mask so that a top electrode 130 is formed on the dielectric film 115. The top electrode film 120 is etched using an etching gas including chlorine ($Cl_2$), nitrogen ($N_2$), and boron chloride ($BCl_3$) using a dry etching process. At that time, the top electrodes 130 of adjacent MIM capacitors are separated from each other.

During etching of the top electrode film 120, the etching gas reacts with the top electrode film. The top electrode film can include a metal or a metal compound such as tantalum nitride, tantalum, titanium, titanium nitride, ruthenium, or platinum. Thus, a hard metallic polymer 135 is formed on a lateral portion of the photoresist pattern 125. The hard metallic polymer 135 includes a metal oxide or a metal nitride such as tantalum oxide ($TaO_x$), tantalum nitride ($TaN_x$), or titanium oxide ($TiO_x$) (wherein x is a positive number). Also, the hard metallic polymer 135 can include a carbon nitride ($CN_x$).

Subsequently, the photoresist pattern 125 is removed using an oxygen ($O_2$) gas based ashing process and a rinsing process. In this case, the hard metallic polymer 135 still remains on the top electrode 130 because the hard metallic polymer 135 formed on the lateral portion of the photoresist pattern 125 cannot be removed during the oxygen gas based ashing process and a wet rinsing process.

Figure 3E:
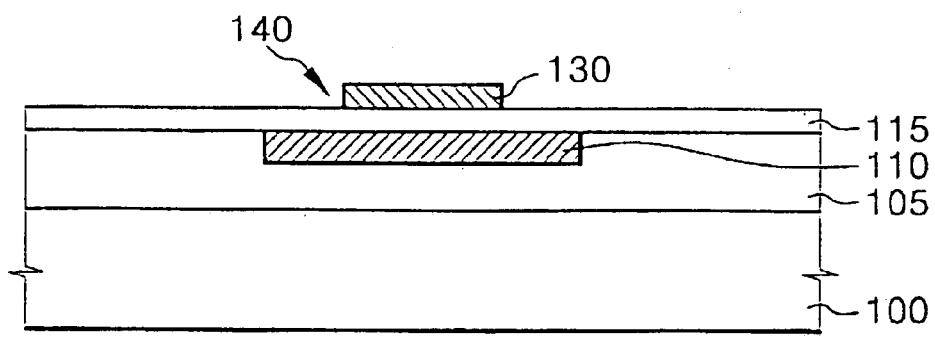

Referring to FIG. 3E, the hard metallic polymer 135 remaining on the top electrode 130 is removed to complete the MIM capacitor 140. In the present embodiment, the hard metallic polymer 135 is removed at a predetermined temperature using a mixture of an oxygen gas and a fluorocarbon ($C_xF_y$) based gas such as $CF_4$, $C_3F_6$, $C_3F_8$, $C_4F_6$, C5F8, etc.

More particularly, the hard metallic polymer 135 is removed using a gas mixture including $O_2$ and $CF_4$ while the substrate 100 is heated to a temperature in the range of about 150° C. to about 250° C. for approximately 20 to 40 seconds. As a result, the hard metallic polymer 135 is completely or substantially removed without lifting the thin films such as the top electrode 130 and the dielectric film 115.

When the process for removing the hard metallic polymer 135 is performed at a temperature of about 150° C. or less, the hard metallic polymer 135 cannot be completely removed. On the other hand, when the process for removing the hard metallic polymer 135 is performed at a temperature of about 250° C. or above, the thin films of the MIM capacitor 140 are lifted because the characteristics of the thin films such as the top electrode 130, the dielectric film 115 and the metal wire 110 have different thermal characteristic, e.g., coefficient of thermal expansion, from each other.

In addition, when the process for removing the hard metallic polymer 135 is performed for approximately 20 seconds with a gas mixture including a fluorocarbon based gas and an oxygen gas, the hard metallic polymer 135 can be substantially removed from the top electrode 130.

The following table indicates the properties of the thin films of the MIM capacitor having a bottom electrode including copper (Cu), a top electrode including tantalum nitride (TaN), and a dielectric film including silicon nitride ($Si_3N_4$).

TABLE

| property | material | | |
|---|---|---|---|
| | $Si_3N_4$ | TaN | Cu |
| density (kg/mm³) | 3,200 | 13,700 | 8,920 |
| thermal conductivity (W/m-K) | 15 | thermal conductivity of Ta is 57 | 400 |
| thermal expansion coefficient (ppm/K) | 3 (thermal expansion coefficient of Si is 2.3) | thermal expansion coefficient of Ta is 6.3 | 16.5 |

In a conventional process of manufacturing the MIM capacitor, because the thermal characteristics of the thin films of the MIM capacitor are different from each other as shown in the above table. The thin films such as the top electrode, the dielectric film, and the bottom electrode may be lifted when the process for removing the hard metallic polymer is performed at a temperature of 250° C. or greater.

Figure 5A:
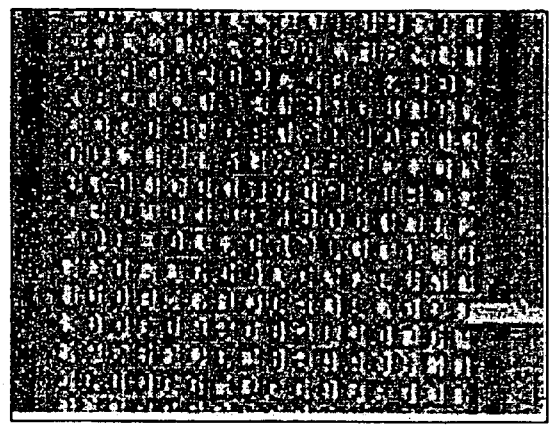
FIG. 5A is an electron microscopic picture showing the lifting of the thin films during the formation of the conventional MIM capacitor.
Figure 5B:
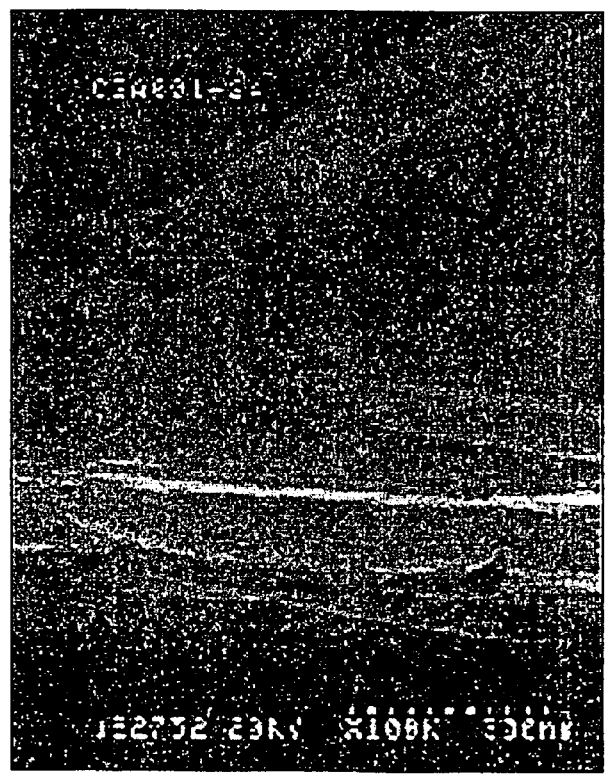
FIG. 5B is a cross-sectional electron microscopic picture showing the lifting of the thin films during the formation of a conventional MIM capacitor.
Figure 6A:
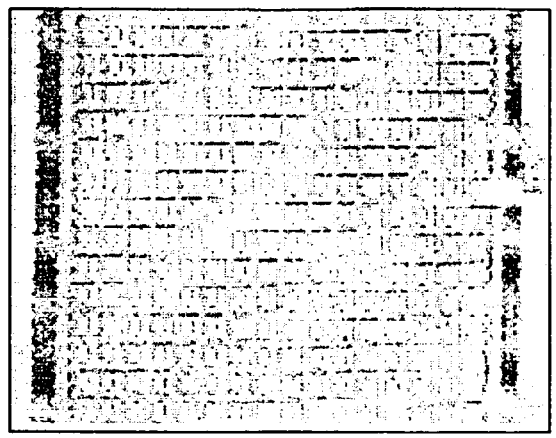
FIG. 6A is a plane electron microscopic picture showing the MIM capacitor formed by removing the hard metallic polymer with a gas mixture including an oxygen gas and a fluorocarbon gas according to the present invention.
Figure 6B:
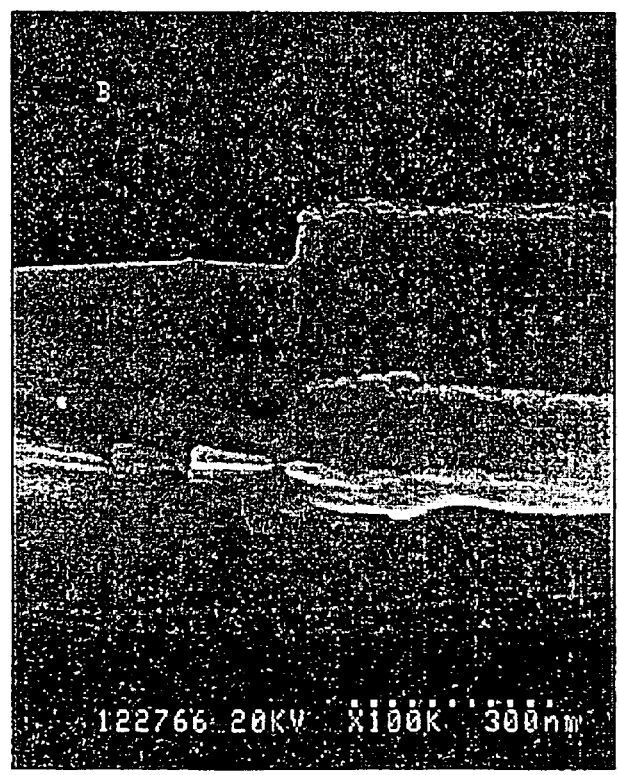
FIG. 6B is a cross-sectional electron microscopic picture showing the MIM capacitor formed by removing the hard metallic polymer with the gas mixture including an oxygen gas and a fluorocarbon gas according to the present invention.

FIGS. 5A and 5B are a plane electron microscopic picture and a cross-sectional electron microscopic picture showing the lifting of the thin films during the formation of the conventional MIM capacitor due to the temperature characteristic differences in the thin films, respectively. FIGS. 6A and 6B are a plane electron microscopic picture and a cross-sectional electron microscopic picture showing the MIM capacitor formed by removing the hard metallic polymer with a gas mixture including an oxygen gas and a fluorocarbon gas at a temperature in the range of about 150° C. to 250° C. for about 20 to 40 seconds according to the present invention, respectively.

Referring FIGS. 5A and 5B, when the process for removing the hard metallic polymer is performed at a high temperature, e.g., above 250° C., to form the MIM capacitor, the dielectric films and the top electrodes of several MIM capacitors are substantially lifted.

As shown in FIG. 5A, the MIM capacitors indicated by bold lines include lifted dielectric films or lifted top electrodes. In those MIM capacitors, the lifted top electrode and the lifted dielectric film can be clearly identified as shown in FIG. 5B. In particular, the lifting of the thin films of the MIM capacitors occurs at the interfaces between the top electrodes and the dielectric films.

As described above, the lifting of the thin films such as the top electrodes, the dielectric films and the bottom electrodes frequently occurs because the intrinsic thermal characteristics, e.g., thermal expansion coefficients, of the thin films are different from each other, and the structural characteristics of the MIM capacitors comprising the thin films have a thickness below about 1,000 Å.

However, the bottom electrode, the dielectric film and the top electrode are not lifted, as shown in FIGS. 6A and 6B, when the hard metallic polymer is removed using the above-described process of the present invention for forming a MIM capacitor, which includes the thin films such as the bottom electrode, the dielectric film and the top electrode.

In the present embodiment, the flow rate of the fluorocarbon gas is 2 percent or less with respect to the total flow rate of the gas mixture. The flow rate of the oxygen gas is 98 percent or above with respect to the total flow rate of the gas mixture.

The substrate 100 including the hard metallic polymer 135 formed thereon is disposed on a heating plate of an etching apparatus, and then the substrate 100 is heated to a temperature in the range of about 150° C. to about 250° C. Also, the substrate 100 including the hard metallic polymer 135 can be disposed on a heating plate of an ashing apparatus, and can be heated to a temperature in the range of about 150° C. to 250° C. for removing the hard metallic polymer 135. Furthermore, the substrate 100 can be heated using a lamp or other heating device for removing the hard metallic polymer 135 from the substrate 100.

When using a gas mixture including an oxygen gas and a fluorocarbon based gas to remove the metallic hard polymer 135, the efficiency for removing the hard metallic polymer 135 increases as the flow rate of the fluorocarbon based gas increases.

On the other hand, an increase in the flow rate of the fluorocarbon based gas may cause damage to the dielectric film 115 of the MIM capacitor 140. Therefore, the dielectric film 115 may be damaged because the exposure of the underlying metal wiring 110 serving as the bottom electrode when the flow rate of the fluorocarbon based gas in the gas mixture is more than 2 percent. However, in case that the fluorocarbon based gas in the gas mixture is controlled at a the flow rate of no more than 2 percent according to the present invention, the hard metallic polymer 135 can be effectively removed without damaging the dielectric film 115.

FIGS. 7A to 7E are cross-sectional views illustrating a method of manufacturing a MIM capacitor according to another preferred embodiment of the present invention.

Figure 7A:
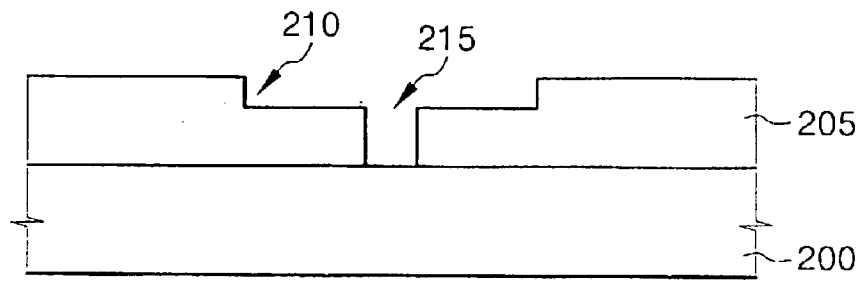
FIGS. 7A to 7E are cross-sectional views illustrating a method of manufacturing a MIM capacitor according to another preferred embodiment of the present invention.

Referring to FIG. 7A, after an-insulation film 205 including TEOS, LT-TEOS, PE-TEOS or BPSG is formed on a semiconductor substrate 200, the insulation film 205 is etched to form a via hole 215 and a groove or a trench 210 having predetermined size.

Figure 7B:
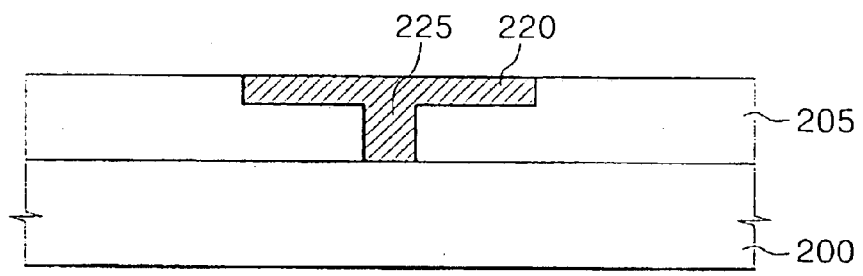

Referring to FIG. 7B, according to a dual damascene process, copper is deposited on the insulation film 205 to fill the via hole 125 and the trench 210 using a sputtering process, a chemical vapor deposition process, or an electro plating process, thereby forming a copper film on the insulation film 205. Then, the copper film is polished using a CMP process to simultaneously form a via contact 225 and a metal wiring 220 in the via hole 215 and the trench 210, respectively. The metal wiring 220 also serves as a bottom electrode of a MIM capacitor.

Figure 7C:
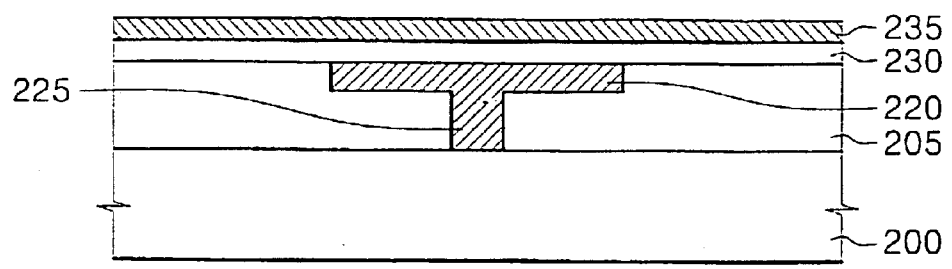

Referring to FIG. 7C, a dielectric film 230 is formed on the insulation film 205 including the via contact 225 and the metal wiring 220. The dielectric film 230 includes a non-oxide material, for example, a nitride such as silicon nitride or boron nitride, or a carbide such as silicon carbide. The dielectric film 230 may include one film comprising either a nitride or a carbide, or the dielectric film 230 may include a multi-layered structure in which an oxide film including silicon oxide is formed on a nitride film or a carbide film.

Subsequently, a top electrode film 235 is formed on the dielectric film 230 by depositing a metal or a metal compound such as tantalum nitride, tantalum, titanium, titanium nitride, ruthenium, or platinum.

Figure 7D:
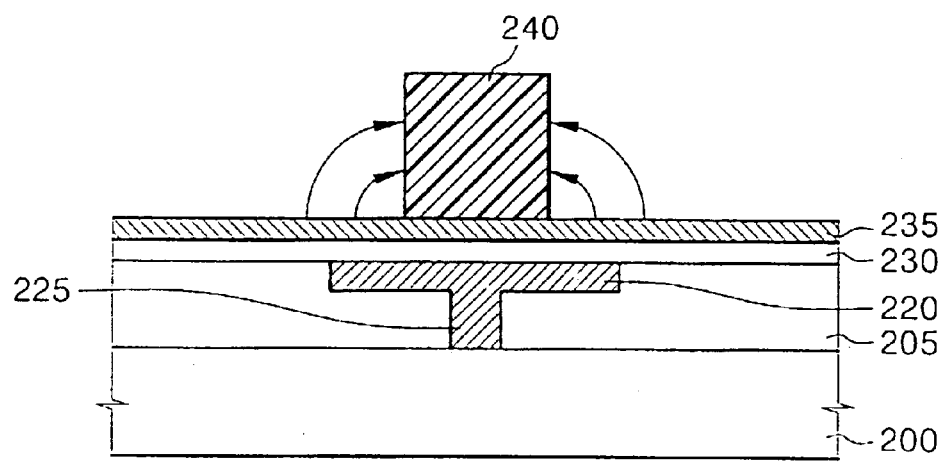

Referring to FIG. 7D, after a photoresist film (not shown) is coated on the top electrode film 235 using a spin coating process, the photoresist film is patterned by a photolithography process so that a photoresist pattern 240 and is used as a mask in the formation of the top electrode of the MIM capacitor.

Figure 7E:
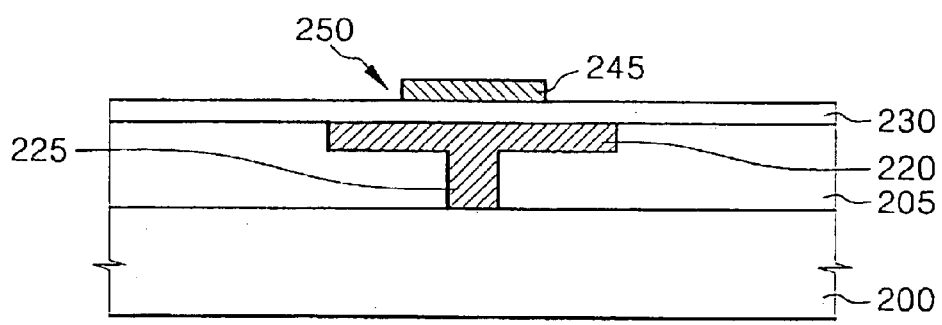

Referring FIG. 7E, the top electrode film 235 is etched using the photoresist pattern 240 as an etching mask to form a top electrode 245 on the dielectric film 230. Then, the photoresist pattern 240 is removed using an ashing process and a rinsing process.

As described above, during etching the top electrode film 235, an etching gas including chlorine, nitrogen, and boron chloride reacts with the top electrode film 235 including the metal or the metal compound and forms a hard metallic polymer including a metal oxide or a metal nitride like tantalum oxide, tantalum nitride, or titanium oxide formed on the lateral portion of the photoresist pattern 240.

The hard metallic polymer is removed in accordance with the process of the above-described embodiment. That is, the hard metallic polymer is completely or substantially removed from the top electrode 245 using a gas mixture of an oxygen gas and a fluorocarbon based gas including $CF_4$, $C_3F_6$, $C_3F_8$, $C_4F_6$, or $C_5F_8$ at a temperature in the range of about 150° C. to 250° C. for about 20 to 40 seconds. In this case, the flow rate of the fluorocarbon based gas in the gas mixture is about 2 percent.

According to the embodiments of the present invention, the hard metallic polymer formed during the formation of the top electrode of the MIM capacitor is removed using the gas mixture including the oxygen gas and the fluorocarbon based gas at a predetermined temperature. The predetermined temperature takes into account the thermal characteristics of the thin films like the top electrode, the dielectric film, and the bottom electrode.

Therefore, the lifting of the thin films can be effectively prevented, and the yield of the manufacturing process for manufacturing a MIM capacitor can be significantly increased.

Also, the MIM capacitor has uniform capacitance because the damage to the dielectric film is prevented, and the oxidation of the bottom electrode during the formation of the top electrode is also prevented using a gas mixture having a pertinent composition.

Having described the preferred embodiments for manufacturing the MIM capacitor, it is noted that modifications and variations can be made by persons skilled in the art in light of the above teachings. It is therefore to be understood that changes may be made in the particular embodiment of the present invention disclosed which is within the scope and the spirit of the invention outlined by the appended claims.

What is claimed is:

1. A method of manufacturing a metal-insulator-metal capacitor comprising:
   forming a metal wire including copper on a substrate;
   forming a dielectric film on the metal wire:
      forming a top electrode film on the dielectric film;
      etching the top electrode film to form a top electrode; and
      removing a hard metallic polymer formed during the etching of the top electrode film.

2. The method of claim 1, wherein the dielectric film includes a nitride including a silicon nitride or a boron nitride, or a carbide including a silicon carbide.

3. The method of claim 1, wherein the dielectric film has a multi-layered structure in which an oxide film is formed on a nitride film including a silicon nitride or a boron nitride, or a carbide film including a silicon carbide.

4. The method of claim 1, wherein the top electrode film includes one selected from the group consisting of tantalum; tantalum nitride, titanium, titanium nitride, ruthenium, and platinum.

5. The method of claim 4, wherein the top electrode film is etched using an etching gas including chlorine, nitrogen, and boron chloride.

6. The method of claim 5, wherein the hard metallic polymer includes tantalum oxide, tantalum nitride, titanium oxide, or titanium nitride.

7. The method of claim 6, wherein the hard metallic polymer is removed using a gas mixture including an oxygen gas and a fluorocarbon based gas.

8. The method of claim 7, wherein a flow rate of the fluorocarbon based gas in the gas mixture is below 2 percent.

9. The method of claim 7, wherein the fluorocarbon based gas includes at least one selected from the group consisting of $CF_4$, $C_2F_6$, $C_3F_8$, $C_4F_6$, and $C_5F_8$.

10. The method of claim 1, wherein the hard metallic polymer is removed by heating the substrate to a temperature in the range of about 150° C. to about 250° C. for approximately 20 to 40 seconds.

11. The method of claim 10, wherein the substrate is heated using a heating plate of an etching apparatus, or a heating plate of an ashing apparatus.

12. The method of claim 10, wherein the substrate is heated using a lamp.

13. A method of manufacturing a metal-insulator-metal capacitor by employing a dual damascene process comprising:
    forming an insulation film on a semiconductor substrate;
    forming a via hole and a trench in the insulation film;
    forming a contact including copper in the via hole, and a metal wire including copper in the trench;
    forming a dielectric film on the insulation film including the metal wire:
       forming a top electrode film on the dielectric film;
       etching the top electrode film to form a top electrode; and
       removing a hard metallic polymer formed during etching the top electrode film.

14. The method of claim 13, wherein the top electrode film includes one selected from the group consisting of tantalum, tantalum nitride, titanium, titanium nitride, ruthenium, and platinum, and the top electrode film is etched using an etching gas including chlorine, nitrogen, and boron chloride.

15. The method of claim 14, wherein the hard metallic polymer includes tantalum oxide, tantalum nitride, titanium oxide, or titanium nitride.

16. The method of claim 15, wherein the hard metallic polymer is removed using a gas mixture including an oxygen gas and a fluorocarbon based gas including at least one selected from the group consisting of $CF_4$, $C_2F_6$, $C_3F_8$, $C_4F_6$, and $C_5F_8$.

17. The method of claim 16, wherein a flow rate of the fluorocarbon based gas in the gas mixture is below 2 percent.

18. The method of claim 13, wherein the hard metallic polymer is removed by heating the substrate to a temperature in the range of about 150° C. to about 250° C. for about 20 to about 40 seconds.

19. The method of claim 18, wherein the substrate is heated using a lamp.

20. The method of claim 18, wherein the substrate is heated using a heating plate.

* * * * *